United States Patent
Kohayashi et al.

(10) Patent No.: US 7,319,195 B2
(45) Date of Patent: Jan. 15, 2008

(54) COMPOSITE CONDUCTOR, SUPERCONDUCTIVE APPARATUS SYSTEM, AND COMPOSITE CONDUCTOR MANUFACTURING METHOD

(75) Inventors: Shuichi Kohayashi, Tokyo (JP); Kazuyuki Uemura, Tokyo (JP); Shigeo Nagaya, Nagoya (JP); Naoji Kashima, Nagoya (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 210 days.

(21) Appl. No.: 10/995,333

(22) Filed: Nov. 24, 2004

(65) Prior Publication Data
US 2006/0021788 A1 Feb. 2, 2006

(30) Foreign Application Priority Data
Nov. 28, 2003 (JP) .............................. 2003-399363
Nov. 18, 2004 (JP) .............................. 2004-334747

(51) Int. Cl.
H01B 12/00 (2006.01)
H01F 6/00 (2006.01)
H01L 39/00 (2006.01)
H01L 39/24 (2006.01)

(52) U.S. Cl. ................... 174/125.1; 505/230; 505/430; 505/886; 505/887; 29/599

(58) Field of Classification Search ...... 174/15.4–15.5, 174/125.1; 505/230–232, 430–434, 886, 505/887; 29/599
See application file for complete search history.

(56) References Cited

U.S. PATENT DOCUMENTS

| | | | |
|---|---|---|---|
| 18,985 A | 12/1857 | Olds | |
| 2,121,275 A | 6/1938 | Zober et al. | |
| 3,527,595 A | 9/1970 | Adler et al. | |
| 4,477,689 A | 10/1984 | Ogasahara et al. | |

(Continued)

FOREIGN PATENT DOCUMENTS

EP 0 459 156 A2 4/1991

(Continued)

OTHER PUBLICATIONS

U.S. Appl. No. 10/984,772, filed Nov. 10, 2004, Nagatomi et al.

(Continued)

Primary Examiner—Jeremy C Norris
(74) Attorney, Agent, or Firm—Oliff & Berridge, PLC.

(57) ABSTRACT

A composite conductor suitable as a connecting conductor that includes a superconductor and is capable of reducing the generation of Joule heat in a joint part between the system side and power-supply sides of a superconductor apparatus. A composite conductor 10 includes a superconductor 12 provided continuously in the flowing direction of the electric current, and a metal conductor 11 joined with the superconductor 12 and provided at least at a joint part with mating conductors 50, 60 to be joined, wherein the electric current is fed and received between the metal conductor 11 and the mating conductors 50, 60 by joining the metal conductor 11 and the mating conductors 50, 60, and wherein the superconductor 12 is arranged in the metal conductor 11 so as to be approximately parallel to the joint surface (joint interface) between the metal conductor 11 and the mating conductors 50,60.

13 Claims, 5 Drawing Sheets

U.S. PATENT DOCUMENTS

| | | | |
|---|---|---|---|
| 4,576,736 A | 3/1986 | Harmuth | |
| 5,398,398 A | 3/1995 | Williams et al. | |
| 5,447,291 A | 9/1995 | Sandhage | |
| 6,670,748 B2 | 12/2003 | Ellens et al. | |
| 7,138,756 B2 | 11/2006 | Gotoh et al. | |
| 2002/0043926 A1 | 4/2002 | Takahashi et al. | |
| 2003/0030038 A1 | 2/2003 | Mitomo et al. | |
| 2003/0030368 A1 | 2/2003 | Ellens et al. | |
| 2003/0094893 A1 | 5/2003 | Ellens et al. | |
| 2003/0132422 A1 | 7/2003 | Tian et al. | |
| 2003/0152804 A1 | 8/2003 | Miura et al. | |
| 2003/0213611 A1* | 11/2003 | Morita | 174/126.2 |
| 2004/0155225 A1 | 8/2004 | Yamada et al. | |
| 2004/0263074 A1 | 12/2004 | Baroky et al. | |
| 2005/0001225 A1 | 1/2005 | Yoshimura et al. | |
| 2005/0189863 A1 | 9/2005 | Nagatomi et al. | |
| 2005/0203845 A1 | 9/2005 | Yoshimine et al. | |
| 2005/0205845 A1 | 9/2005 | Deising et al. | |
| 2005/0253500 A1 | 11/2005 | Gotoh et al. | |
| 2005/0267243 A1 | 12/2005 | Amasaki et al. | |
| 2006/0006782 A1 | 1/2006 | Nagatomi et al. | |
| 2006/0017365 A1 | 1/2006 | Nagatomi et al. | |
| 2006/0021788 A1 | 2/2006 | Kohayashi et al. | |
| 2006/0022573 A1 | 2/2006 | Gotoh et al. | |
| 2006/0033083 A1 | 2/2006 | Sakane et al. | |
| 2006/0043337 A1 | 3/2006 | Sakane et al. | |
| 2006/0045832 A1 | 3/2006 | Nagatomi et al. | |
| 2006/0065878 A1 | 3/2006 | Sakane et al. | |
| 2006/0076883 A1 | 4/2006 | Himaki et al. | |
| 2006/0091790 A1 | 5/2006 | Nagatomi et al. | |
| 2006/0170332 A1 | 8/2006 | Tamaki et al. | |
| 2006/0197432 A1 | 9/2006 | Nagatomi et al. | |
| 2006/0197439 A1 | 9/2006 | Sakane et al. | |
| 2006/0220047 A1 | 10/2006 | Nagatomi et al. | |
| 2006/0220520 A1 | 10/2006 | Sakane et al. | |
| 2006/0244356 A1 | 11/2006 | Nagatomi et al. | |
| 2007/0007494 A1 | 1/2007 | Hirosaki et al. | |
| 2007/0029525 A1 | 2/2007 | Gotoh et al. | |
| 2007/0164308 A1 | 7/2007 | Yoshimura et al. | |

FOREIGN PATENT DOCUMENTS

| | | |
|---|---|---|
| EP | 0 459 156 A2 | 12/1991 |
| EP | 1 296 376 A2 | 3/2003 |
| EP | 1 445 295 A1 | 8/2004 |
| JP | 05-015655 | 1/1993 |
| JP | A 05-198433 | 8/1993 |
| JP | 11-144938 | 5/1999 |
| JP | A 11-144938 | 5/1999 |
| JP | 11-277527 | 10/1999 |
| JP | 2000-073053 | 3/2000 |
| JP | 2000-153167 | 6/2000 |
| JP | 2001-214162 | 8/2001 |
| JP | 2002-363554 | 12/2002 |
| JP | 2003-013059 | 1/2003 |
| JP | 2003-096446 | 4/2003 |
| JP | 2003-124527 | 4/2003 |
| JP | 2003-515655 | 7/2003 |
| JP | 2003-277746 | 10/2003 |
| JP | 2003-336059 | 11/2003 |
| JP | 2004-055910 | 2/2004 |
| JP | 2004-505470 | 2/2004 |
| JP | 2004-067837 | 3/2004 |
| JP | 2004-145718 | 5/2004 |
| JP | 2004-166058 | 6/2004 |
| JP | 2004-189997 | 7/2004 |
| JP | 2004-207271 | 7/2004 |
| JP | A-2004-186278 | 7/2004 |
| JP | 2004-235598 | 8/2004 |
| JP | 2004-248405 | 8/2004 |
| JP | 2004-250920 | 8/2004 |
| JP | 2004-253312 | 8/2004 |
| JP | 2004-244560 | 9/2004 |
| JP | 2004-055536 | 12/2004 |
| JP | 2004-368153 | 12/2004 |
| JP | 2005-075854 | 3/2005 |
| JP | 2005-103429 | 3/2005 |
| JP | 2005-105126 | 3/2005 |
| JP | 2005-192691 | 6/2005 |
| JP | 2005-344025 | 12/2005 |
| JP | 2006-028295 | 2/2006 |
| JP | 2006-063214 | 3/2006 |
| JP | 2006-063286 | 3/2006 |
| JP | 2006-070109 | 3/2006 |
| JP | 2006-176546 | 7/2006 |
| WO | WO 01/40403 A1 | 6/2001 |
| WO | WO 02/11214 A1 | 2/2002 |
| WO | WO 2004/030109 A1 | 4/2004 |
| WO | WO 2004/039915 A1 | 5/2004 |
| WO | WO 2004/055910 A1 | 7/2004 |
| WO | WO 2005/052087 A1 | 6/2005 |

OTHER PUBLICATIONS

U.S. Appl. No. 11/061,669, filed Feb. 22, 2005, Nagatomi et al.
U.S. Appl. No. 11/063,847, filed Feb. 23, 2005, Sakane et al.
U.S. Appl. No. 11/149,317, filed Jun. 10, 2005, Nagatomi et al.
U.S. Appl. No. 11/149,192, filed Jun. 10, 2005, Sakane et al.
U.S. Appl. No. 11/198,281, filed Aug. 8, 2005, Nagatomi et al.
U.S. Appl. No. 11/194,590, filed Aug. 2, 2005, Gotoh et al.
U.S. Appl. No. 11/211,751, filed Aug. 26, 2005, Sakane et al.
U.S. Appl. No. 11/218,504, filed Sep. 6, 2005, Nagatomi et al.
JIS Z 8726; "Method of Specifying Colour Rendering Properties of Light Sources"; (1990), pp. 381-390.
"Phosphor Handbook"; (compiled by Phosphor Research Society, published by Ohmusha, Ltd., 1987); pp. 172-176.
U.S. Appl. No. 11/194,590, filed Aug. 2, 2005.
K. Uheda et al., "The Crystal Structure and Photoluminescence Properties of a New Red Phosphor, Calcium Aluminum Silicon Nitride Doped With Divalent Euroium," Abs. 2073, 206th Meeting., Oct. 3, 2004.

* cited by examiner

COMPOSITE CONDUCTOR, SUPERCONDUCTIVE APPARATUS SYSTEM, AND COMPOSITE CONDUCTOR MANUFACTURING METHOD

BACKGROUND OF THE INVENTION

1. Field of the Invention

The present invention relates to a composite conductor suitable for connecting conductors of a feeding passage to a superconducting system such as MRI (magnetic resonance imaging), linear motor, SMES (superconducting magnetic energy storage), and the like, and in particular, to a composite conductor composed of a superconductor and a metal conductor joined to each other to allow carrying a large current at a low resistance.

2. Description of the Related Art

In superconducting equipment such as a superconducting magnet, for convenience of laying out wirings, some parts between the metal conductors and between the metal conductor and the superconductor require to be joined to each other. For example, in some cases, a current lead electrode part (formed of a metal conductor) by which a current of several hundred of amperes to several thousand of amperes is fed to the superconducting system under a cryogenic condition from an external power source device under a room temperature, and a superconductive lead wire stretched from a magnet, are joined to each other via a connecting conductor, as shown in FIG. 5.

As a connecting conductor used in such joint part is used in general a high-purity copper, which is relatively well balanced considering electric resistance value, cost, processability, and so forth. In FIG. 5, "1" designates the current lead placed on a power-supply side, "2" designates the superconducting lead wire stretched from the magnet (system side), and "3" designates the connecting conductor connecting the current lead 1 and the superconducting lead wire 2. Plate-like metal electrodes 1a and 1b are provided on both sides of the current lead 1, and one end 3a of the connecting conductor 3 is pressure-contact-fixed to one end of the metal electrode 1a by a screw-type clamp 4 (pressure-contact method). Further, the other end 3b of the connecting conductor 3 is welded to an end portion 2a of the superconducting lead wire 2 stretched from the magnet by a solder 5 (solder method). Here, the pressure-contact method using the screw-type clamp 4 allows easy attachment and detachment, but has a disadvantage that a drift, which is an irregular current flowing in the joint surface in a deviated manner, is liable to be generated. Also, the problem in the solder method is that although the drift is suppressed to be relatively small, it is difficult to join the metal conductor and the superconductor so as to assure the uniformity of the contact resistance in an interface of the joint part, and it is also remained to be difficult to suppress the generation of the drift, further involving trouble of attaching and detaching (for example, refer to Patent document 1).

(Patent Document 1)
Japanese Patent Application Laid-open No. Hei 5-198433

In recent years, with advancement in development of superconductive application apparatus, the compact superconductive application apparatus having high-level performance of the joint part, with little generation of Joule heat, and easily attachable and detachable, is required.

However, the problem in joint using the conventional metal conductor is that a large contact resistance caused by drift is generated at joint parts between an electrode part of the current lead and a superconducting lead wire, and in order to decrease such a contact resistance, the joint area requires to be increased, resulting in making a large joint part. In addition, the pressure-contact method allowing relatively easy attachment and detachment causes a large drift, resulting in a large contact resistance.

SUMMARY OF THE INVENTION

It is therefore an object of the present invention to provide a composite conductor suitable as a connecting conductor capable of reducing generation of Joule heat in a joint part between a conductor on a system side and a conductor on a power-supply side, realizing a compact superconductive apparatus system, and suppressing generation of heat to minimum in the system.

In order to solve the above-described problem, a first aspect of the present invention is to provide a composite conductor comprising a superconductor provided in a current flowing direction and a metal conductor joined to the superconductor and provided at least in a joint part with the mating conductor to be joined, wherein an electric current is fed and received when the mating conductor is joined with the metal conductor, and the superconductor is disposed in the metal conductor so as to be approximately parallel to the joint interface between the metal conductor and the mating conductor.

By using the composite conductor having the above-described structure, contact resistance value between the conductors is reduced when feeding and receiving the electric current between the metal conductor and the mating conductor joined, thereby suppressing Joule heat generated in this part.

A second aspect of the present invention provides the composite conductor according to the first aspect of the present invention, wherein the superconductor is formed in an almost columnar shape, and disposed so that the longitudinal direction thereof is approximately parallel to the joint interface.

By forming the superconductor in an almost columnar shape, the superconductor can be easily disposed in the metal conductor so as to be approximately parallel to the joint interface with the mating conductor, and a compact composite conductor can thereby be formed.

A third aspect of the present invention provides the composite conductor according to either of the first or second aspect of the present invention, wherein the superconductor is an oxide superconductor formed by a melting method. By forming the oxide superconductor by the melting method, since critical temperature and critical current density is high and mechanical strength is large, the composite conductor having preferable electric characteristics and mechanical characteristics can be manufactured.

A fourth aspect of the present invention provides the composite conductor according to any one of the first to third aspects of the present invention, wherein the superconductor is formed by joining a plurality of conductors.

By using the superconductor formed by joining a plurality of conductors, a manufacturing cost of the composite conductor can be reduced.

A fifth aspect of the present invention provides the composite conductor according to any one of the first to fourth aspects of the present invention, wherein the metal conductor and the superconductor are joined by interposing a jointing metal therebetween, and volume of pores present in the jointing metal occupies not more than 5% of the volume of a gap at the joint part.

A sixth aspect of the present invention provides a superconductive apparatus system using the composite conductor according to any one of the first to fifth aspects of the present invention.

A seventh aspect of the present invention provides a method of manufacturing a composite conductor, comprising a superconductor provided in a flowing direction of an electric current, and a metal conductor joined with the superconductor and provided at least in a joint part with a mating conductor to be joined, wherein the electric current is fed and received between the metal conductor and the mating conductor when the mating conductor is joined with the metal conductor, the method of manufacturing the composite conductor comprising: heating the joint part at or above a melting point of the jointing metal, and reducing the pressure to degas the jointing metal when the oxide superconductor and the metal electrode are joined with each other by the jointing metal.

By setting the volume of the pores present in the jointing metal, by which the metal conductor and the superconductor are joined, so as to occupy not more than 5% of the volume of a gap at the joint part, the flow of the electric current in this part is smoothened, thereby reducing the contact resistance value when a prescribed electric current is flown to the composite conductor, and thereby suppressing the Joule heat generated in this part.

The present invention provides the composite conductor comprising the superconductor provided continuously in the flowing direction of the electric current, and the metal conductor joined with the superconductor and provided at least at the joint part with the mating conductor to be joined, wherein the electric current is fed and received between the metal conductor and the mating conductor when the mating conductor is joined with the metal conductor. Also, in this structure, the superconductor is disposed in the metal conductor so as to be approximately parallel to the joint interface between the metal conductor and the mating conductor. By thus forming the composite conductor, the contact resistance value of the joint part, where the electric current is fed and received, is reduced, and the Joule heat generated in this part is accordingly suppressed.

BRIEF DESCRIPTION OF THE DRAWINGS

FIGS. 1A, 1B, and 1C are block diagrams of a composite conductor according to an embodiment of the present invention, of which FIG. 1A is an perspective exploded view, FIG. 1B is a perspective external view, FIG. 1C is a sectional view of Ic to Ic of FIG. 1B seen in a direction of arrows;

DETAILED DESCRIPTION OF THE PREFERRED EMBODIMENTS

The inventors discover that by disposing a superconductor in a metal conductor so as to be approximately in parallel to a joint interface with a mating conductor to be joined, if a potential difference along the joint interface can be reduced, generation of drift can be suppressed at a macroscopic level even if the nonuniformity of contact resistance exists in the interface part between the mating conductor and the metal conductor at a microscopic level, so that the contact resistance value of that part can be reduced. As a result of the discovery, the inventors accomplish the present invention.

Hereinafter, an embodiment according to the present invention will be explained with reference to drawings.

Figure 1A:
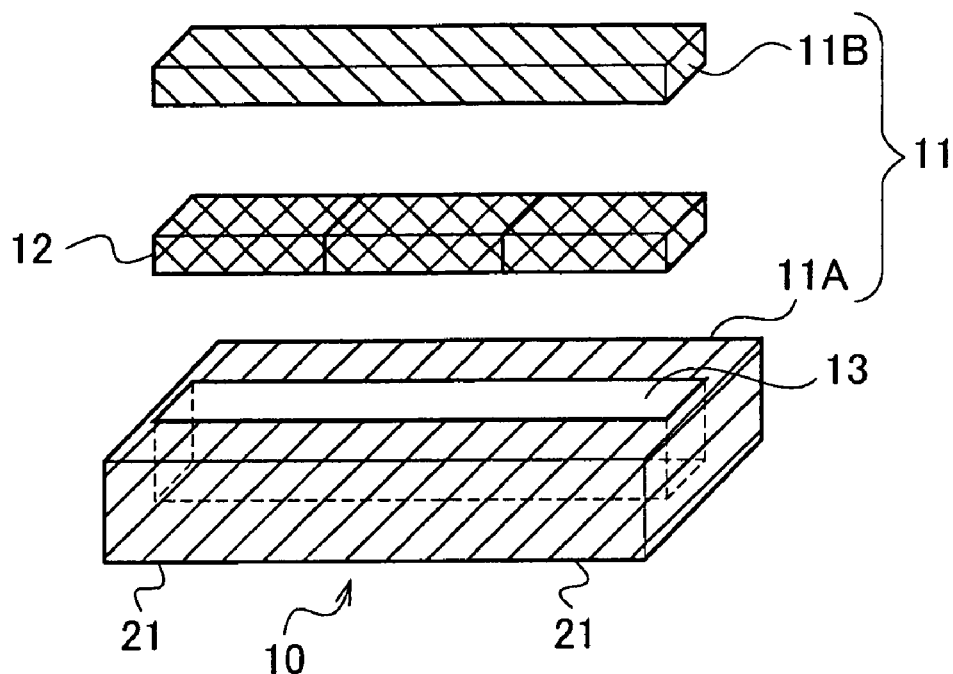
Figure 1B:
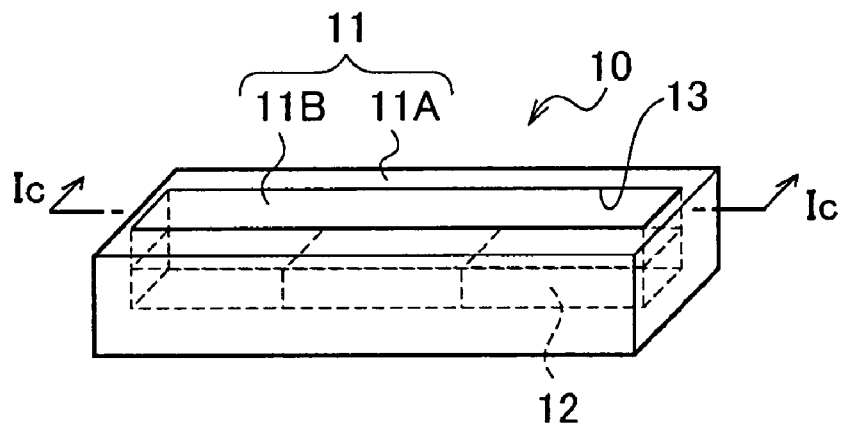
Figure 1C:
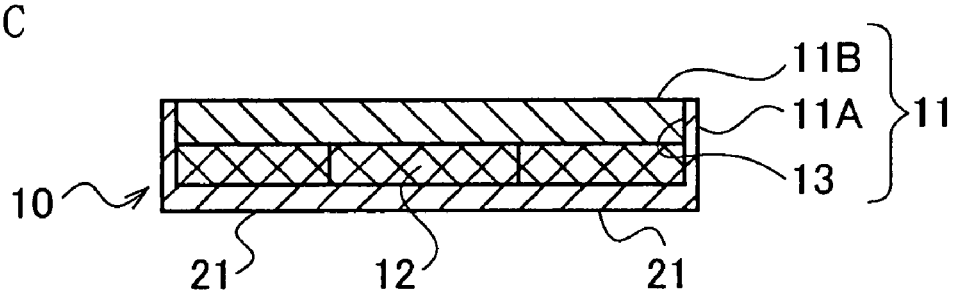

FIGS. 1A, 1B, and 1C are block diagrams of a composite conductor 10 which represent the embodiment. FIG. 1A is a perspective exploded view, FIG. 1B is an perspective external view, and FIG. 1C is a sectional view of Ic to Ic of FIG. 1B taken along the Ic-Ic line.

In FIGS. 1A, 1B, and 1C, the composite conductor 10 is almost columnar-shape in its entirety, and formed as a complex having therein a prismatic superconductor 12 continuing in a longitudinal direction and embedded inside a metal conductor 11. The metal conductor 11 has a prismatic body 11A forming a groove 13 on an upper surface thereof to house the superconductor 12, and a lid 11B fitted to the groove 13 over the superconductor 12 which is housed into the groove 13 in advance. The groove 13 is formed in parallel to a current-feeding longitudinal direction, and the superconductor 12 continues in the current flowing direction. The composite conductor 10 is just required to be substantially prismatic in its entirety, and its section may take various shapes such as polygon including triangle or rectangle, circle, oval, pentangle, and so forth.

In the composite conductor 10, a bottom side portion of both ends of the longitudinal direction of the metal conductor 11 becomes joint surfaces 21 to be joined to a mating conductor. By surface-joining the mating conductor and the joint surface 21, current is fed and received to and from the mating conductor. Accordingly, the superconductor 12, which is a principal in carrying current, is arranged within the metal conductor 11 so as to be approximately in parallel to the joint interfaces (joint surfaces 21) between the metal conductor 11 and the mating conductors.

Incidentally, it is preferable that the surfaces of the body 11A and the lid 11B of the metal conductor 11 are provided in advance with the plating composed mainly of just tin, silver, gold, nickel, zinc, palladium, or an alloy, or a multilayer body of such plating, so that wettability of a jointing metal described later (not shown) can be enhanced, and the contact resistance with a conductor stretched from the power supply side and a conductor stretched from the system side can be reduced.

In addition, although the superconductor 12 embedded into the metal conductor 11 may take an integral form, the illustrated example shows a superconductor divided into several conductors along the longitudinal direction. Depending on the entire length the superconductor, several conductors arranged in parallel may be employed. For such a superconductor 12, a rare-earth-oxide superconductor having high mechanical strength is used that can carry a large current in spite of its small cross sectional area. The rare-earth-oxide superconductor 12 manufactured by a melting method and crystal oriented, is embedded in the metal conductor 11 so that a current flowing direction is substantially perpendicular to the "c" axis direction of the crystal.

Accordingly, a compact composite conductor 10 can be realized in which a large current can be carried at a low resistance. On the other hand, the rare-earth-oxide superconductor manufactured by the melting method cannot be made to have a long length, so that when it is required to have a long length, it is divided into several conductors to be embedded along a longitudinal direction, enabling low-cost manufacturing.

Further, each surface of the prismatic superconductor 12 faces an inner surface of the groove 13 and an inner surface of the lid 11B of the body 11A when housed in the metal conductor 11. For this reason, the six surfaces of the superconductor 12 are silver-coated in advance so that the contact resistance value can be reduced. Silver coating can be carried out by employing a silver paste applying and baking method, a plating method, a vapor deposition method, a spattering method, a thermal spraying method, and so forth, among which a suitable method can be selected in light of productivity and mass productivity.

Furthermore, in order to reduce the contact resistance between the superconductor 12 and the metal conductor 11 described above, it is preferable to use a jointing metal (not shown) in joining the conductors together. In order to join them, it is preferable that the jointing metal is molten and applied to the inner surface of the groove 13 for embedding the superconductor 12, into which the superconductor 12 with the molten jointing metal applied over the silver coating thereof is disposed. Further, when necessary, it is preferable to inject the molten jointing metal into the gap between the superconductor 12, the inner surface of the groove 13, and the lid 11B, and cool to solidify the jointing metal to join them together.

As the jointing metal, various suitable solders with melting points at 300° C. or lower are used to prevent that the superconductor 12 is excessively heated in melting and applying the jointing metal, thereby causing oxygen to come out of the superconductor 12. In particular, in order to enhance adhesiveness of the joint part and reduce the contact resistance, it is preferable to use a Pb—Sn solder or an In solder added with Gd, Zn, Sb, and so forth for example, so that both adhesiveness with ceramic and wettability are enhanced. Here, Cerasolzer (registered trademark) is presented as a preferable example of a solder for ceramic below.

Cerasolzer 143 manufactured by Asahi Glass Co., Ltd.
Component Sn: 45 to 51 (wt %)
Pb: 26 to 32
Gd: 16 to 22
Zn: 2 to 4
Sb: 1 to 3
Melting point 143° C.
Cerasolzer 123 manufactured by Asahi Glass Co., Ltd.
Component In: 44 to 50 (wt %)
Gd: 45 to 50
Zn: 1 to 3
Sb: less than one
Melting point 123° C.

As described above, with the metal conductor 11 and the superconductor 12 joined together in such a manner that the superconductor 12 is fitted to the groove 13 formed on the main body 11A of the metal conductor 11, and with the lid 11B of the metal conductor 11 covered over the superconductor 12, the jointing metal is interposed in the gap, so that the metal conductor 11 and the superconductor 12 can be electrically joined together in a surface-contact state in a complete manner as observed at a microscopic level. As a result, the contact resistance values of the metal conductor 11 and the superconductor 12 can be reduced.

Note that the gap caused by fitting the lid 11B of the metal conductor 11 to the groove 13 of the body 11A is preferably about 0.05 to 0.5 mm on a single side. A gap of 0.05 mm or wider allows sufficient degassing of the jointing metal, while a gap of 0.5 mm or narrower prohibits an unwanted increase of the contact resistance value due to a greater volume of the jointing metal. Accordingly, the gap forms a degassing part.

Incidentally, the inventors discover that the following problems may occur when the jointing metal (solder) is used to join the metal conductor 11 and the superconductor 12.

A first problem is that when the jointing metal is molten and applied to the body 11A and the lid 11B of the metal conductor 11 and the superconductor 12 to integrate them, a gaseous component such as atmosphere and so forth is involved in the molten jointing metal. The gaseous component involved in the jointing metal forms pores within the jointing metal when the jointing metal is solidified. The problem is that such pores formed within the jointing metal results in narrowing of the flowing passage of current flowing between the metal conductor 11 and the superconductor 12 through the jointing metal, so that this part becomes another cause to increase the contact resistance value when a prescribed current, such as a large current of for example 1000 A, is carried.

A second problem is that when an oxide superconductor having a high critical temperature and a critical current density is used as the superconductor 12, thermal hysetresis is repeated between the room temperature and the liquid helium temperature or between the room temperature and the liquid nitrogen temperature with respect to the oxide superconductor 12 embedded in the metal conductor 11, so that stress is imposed due to a linear expansion coefficient difference between the metal conductor 11 and the superconductor 12 when the composite conductor 10 is in use. At this point, if the pores described above are formed in the joint part of both conductors, the stress is concentrated to such pores, causing a crack to the oxide superconductor which is embedded, and significantly deteriorates the characteristic thereof.

Figure 2:
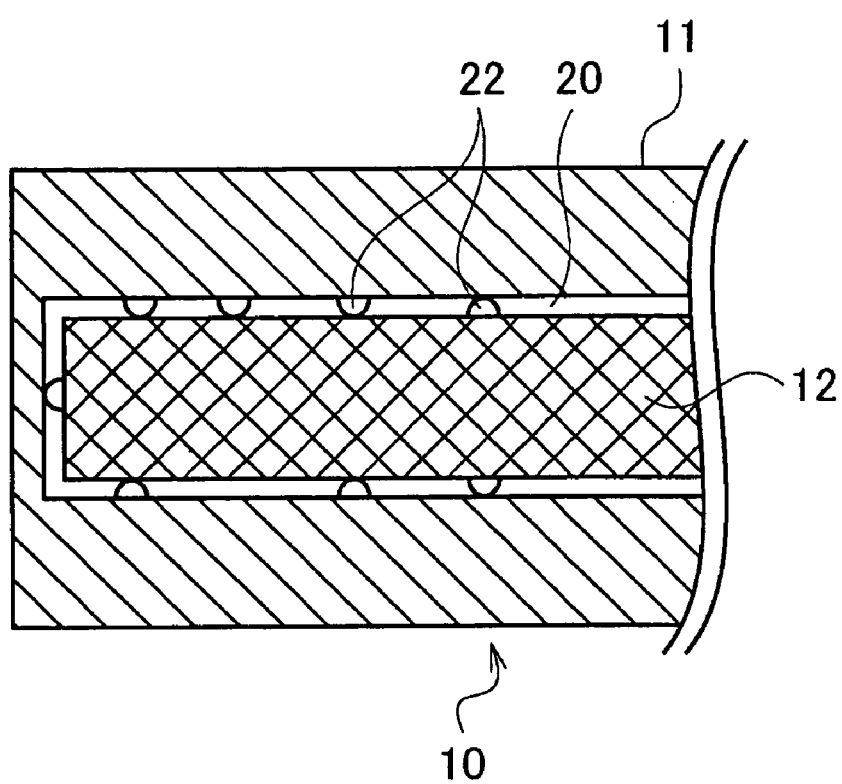
FIG. 2 is a partial sectional view of a composite conductor for explaining the pores in a jointing metal which joins a metal conductor and a superconductor constituting the composite conductor.

Hereinafter, the pores generated in the joint part of the metal conductor 11 and the superconductor 12 are explained with reference to FIG. 2 showing a partial sectional view of the composite conductor 10.

In the groove 13 provided in the metal conductor 11, the superconductor 12 is disposed which is entirely silver-coated, and in the joint part thereof (gap), the jointing metal 20 is interposed, in which pores 22 are generated.

When the pores 22 constitute about 10% or more of the joint part in volume, they become a cause of cracking of the embedded oxide superconductor 12, as described above, and become a cause of occurrence of contact resistance value when a prescribed current is fed to the composite conductor 10. The ratio of the volume of the pores 22 to that of the joint part is measured by the following method, for example. The joint part is sequentially cut out along the longitudinal direction of the composite conductor 10, and a ratio between the cross sectional area the pore 22 and the cross sectional area of the joint part appearing on the cut surface is measured, the measured values being sequentially multiplied.

In order to suppress or prevent generation of the pores 22 in the jointing metal, the jointing metal are first applied to the embedding groove 13 for the superconductor 12 and so forth in the atmosphere. The superconductor 12 is then disposed in the embedding groove 13 for the superconductor 12 and heated, thereby the jointing metal is molten to join them together. Here, it is preferable that this part is exposed in vacuum and the gaseous component in the jointing metal is eliminated by using a vacuum degassing method. A condition for the vacuum degassing is that while the temperature for heating the jointing metal should be at the melting point or higher, it is preferably at about the melting point plus 15 to 100° C. considering the necessity of proceeding degassing in a short period of time and suppressing oxidization of the jointing metal. Further, while the degree of ambient vacuum for the effective degassing is 0.01 MPa or less, it is more preferable that it is 10 Pa or less, so that degassing completes in four to five seconds. With such a level of temperature and degassing time, it does not need to be given consideration that oxygen may come out of the superconductor 12. As a result, the volume of the pores 22 in the jointing metal which is provided in the joint part consisting of the embedding groove 13 for the superconductor 12, the superconductor 12, and the lid 11B of the metal conductor 11, can be controlled so as not amount to more than 5% of the volume of the joint part.

When the pores 22 are suppressed to amount to about 10% or less of the joint part in volume by using such a vacuum degassing method, the composite conductor 10 under a temperature cycle of "the room temperature to 4.2 K" does not cause cracking in the embedded superconductor 12. Further, carrying a prescribed current does not increase the contact resistance value which is ascribable to deterioration.

The composite conductor 10 of the present embodiment is structured by embedding the superconductor 12 into the metal conductor 11 in a manner of forming the groove 13 on the upper surface of the body 11A of the metal conductor 11, housing in the groove 13 the superconductor 12, and covering the superconductor 12 with the lid 11B. However, it should be noted that as other embodiments, a composite conductor can be formed in a manner that at one end of a metal conductor is a hole is provided and a superconductor is fitted thereto, or a metal conductor can be structured in a decomposable manner, and a composite conductor is assembled by sandwiching a superconductor between components of the metal conductor. Further, the superconductor may take an optional shape such as a cylindrical or columnar shape.

Figure 3:
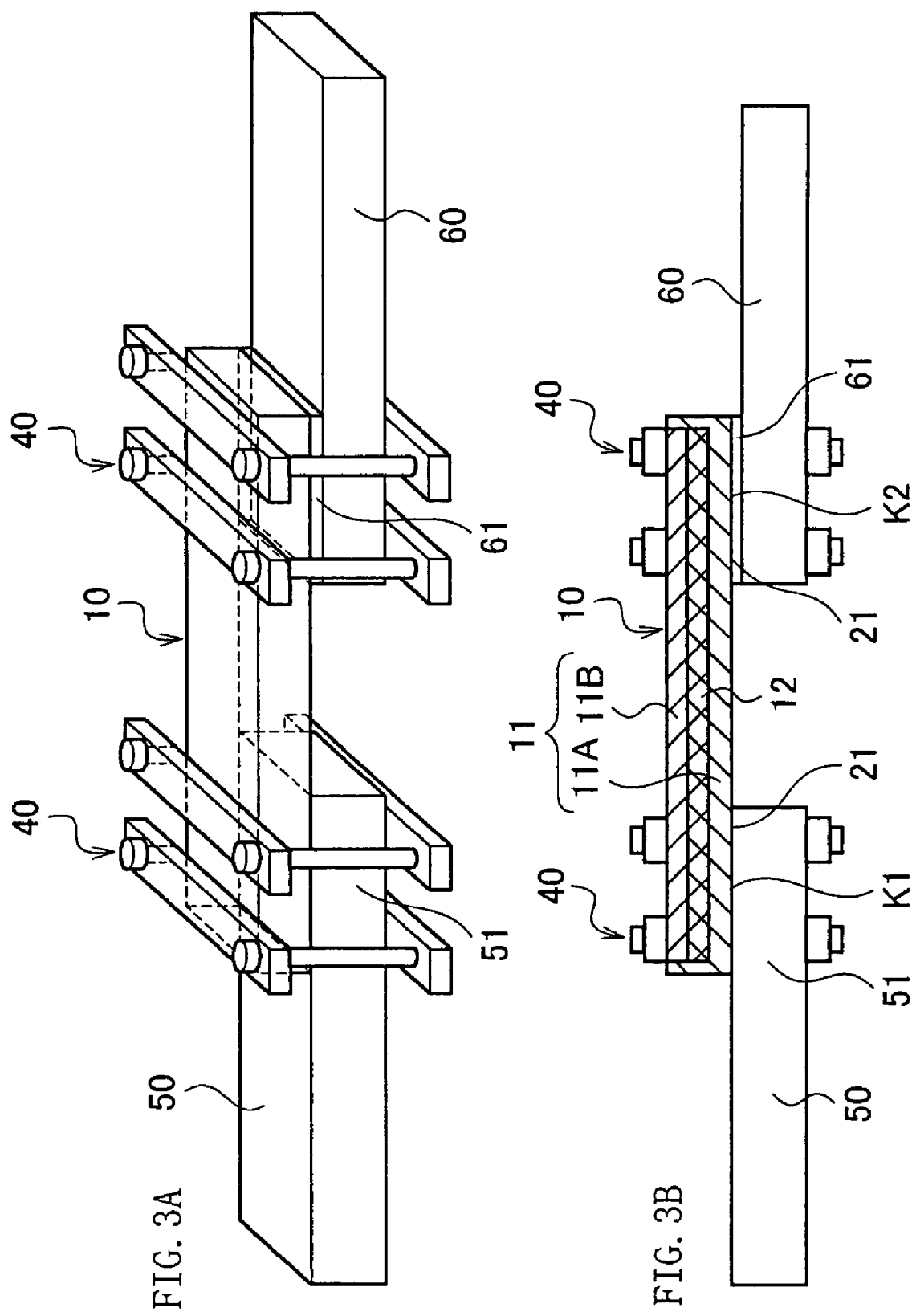
FIGS. 3A is a perspective external view, and 3B is a side sectional view, showing an example of connecting a conductor on a power supply side and a conductor on a system side using the composite conductor of the present invention.

Next, a structure in a case that a composite component 10 as structured above is connected to conductors (mating conductors) stretched from a power-supply side and to a superconducting system side respectively is explained by reference to FIGS. 3A and 3B. FIG. 3A is an overall perspective view, and FIG. 3B is a sectional view.

In FIGS. 3A and 3B, "10" designates a composite conductor, "50" designates a current lead stretched from the power-supply side (mating conductor), and "60" designates a superconducting lead wire stretched from the system side (mating conductor). On the left side of the composite conductor 10 in the drawing, a metal electrode part 51 of the current lead 50 stretched from the power-supply side through an indium foil (not shown) is joined using binding-type clamps 40. The plate-like metal electrode part 51 of the current lead 50 is joined to the composite conductor 10 in a manner that its planar surface is pressure-contacted against a joint surface 21 of the composite conductor 10.

Further, on the right side of the composite conductor 10 in the drawing, a superconducting lead wire 60 stretched from the system side is joined using the binding-type clamps 40. The superconducting lead wire 60 is soldered to a pressure-contact metal plate 61 in advance, and is joined to the composite conductor 10 so that a surface opposite to the soldered surface of the pressure-contact metal plate 61 is contact-pressured against a joining surface 21 of the composite conductor 10 through an indium foil.

By thus joining the metal electrode part 51 of the current lead 50 and the pressure-contact metal plate 61 of the superconducting lead wire 60 to a joint surface 21 of both ends of the composite conductor 10 as shown in FIG. 3B, the longitudinal direction of the superconductor 12 in the composite conductor 10 becomes approximately in parallel to a joining interface K1 joining the metal electrode potion 51 of the power-supply-side electric lead 50 and the composite conductor 10, and a joining interface K2 joining the pressure-contact metal plate 61 of the system-side superconducting lead wire 60 and the composite conductor 10.

Here, the current lead 50 is a conductor for feeding current from a power supply not shown to a superconducting system not shown, and its configuration most frequently applied is a configuration in which the metal electrode part 51 is joined to both ends portion of an oxide superconductor, which is effective in controlling thermal invasion from the power supply to the system side. It is preferable that plating mainly composed of just tin, silver, gold, nickel, zinc, palladium, or an alloy, or a multilayer body of such plating is provided in advance to the surface of the metal electrode part 51 of the current lead 50, the surface of the composite conductor 10, or the surface of the pressure-contact metal plate 61.

Note that it is also possible to join an overlapping part of the composite conductor 10 and the mating conductors (the metal electrode part 51 of the current lead 50 and the pressure-contact metal plate 61 soldered to the superconducting lead wire 60) by welding, brazing, or soldering at a low melting point. However, considering attachability and detachability, it is preferable to fasten at least one of the both ends of the composite conductor 10 with the clamps 40 as shown, or with screws.

Next, current which occurs from the power-supply, flows through the power-supply-side current lead 50, the composite conductor 10, and the system-side conductor (superconducting lead wire 60), and reaches the superconducting system is explained. This flow of current, which is under study and yet to be resolved in detail, can be outlined as follows. For the convenience of explanation, the left side in the drawing is referred to as "power-supply side" while the right side is referred to as "system side", the composite conductor 10 being a center.

When the above composite conductor 10 is used, it is used at such a temperature that the superconductor 12 therein becomes a superconducting state. As a result of this, the potential difference is reduced across almost the entire length in the composite conductor 10.

Here, the current flowing from the left side in the drawing through the power-supply side conductor (current lead 50) is considered to gradually flow into the composite conductor 10 across almost the entire area of the overlapping part of the power-supply side conductor (current lead 50) and the composite conductor 10 (joining interface K1 of the power-supply side joint part) almost evenly. Accordingly, should drift of current be generated due to nonuniformity in the state of metal or state of joining at a microscopic level, it is smoothened at a macroscopic level, thereby substantially reducing the contact resistance (to approximately $\frac{1}{10}$, as will be described in detail in the experimental example), and largely suppressing generation of Joule heat.

The current flowing into the superconductor 12 in the composite conductor 10 flows through the superconductor 12 without generating Joule heat, and reaches the system-side joint part (joining interface K2). Then, with the mechanism similar to that of the power-supply-side joint part explained above, the current flows into the system-side conductor (pressure-contact metal plate 61) while its contact resistance is largely controlled (to be approximately 1/10, as will be described in the experimental example) across almost the entire area of the overlapping part (the joining interface K2 of the system-side joint part) of the system-side conductor (pressure-contact metal plate 61) and the composite conductor 10. The current further flows into the superconducting lead wire 60 and reaches the superconducting system. Accordingly, the generation of Joule heat is greatly suppressed in the system-side joint part as well. This allows manufacturing of a compact superconductive apparatus system with low running costs.

In order to attain the substantial reducing effect of the contact resistance value in the joint part of the power-supply-side conductor (current lead 50) and the composite conductor 10, and in the joint part of the system-side conductor (pressure-contact metal plate 61) and the composite conductor 10, the power-supply-side conductor (current lead 50) and the composite conductor 10, and the system-side conductor (pressure-contact metal plate 61) and the composite conductor 10, should be respectively arranged in such a manner that their end portions are overlappingly placed short of the each other's end portion, as shown in FIGS. 3A and 3B. While a larger extent of overlapping is preferable, the effect of the present invention can be attained so long as an overlapping surface area of both superconductors exceeds a sum of cross sectional areas of the conductor-side superconductor and the electrode-side superconductor.

Further, although it is preferable that the superconductor 12 to be embedded in the composite conductor 10 is embedded in the entire longitudinal direction, the effect of the present invention can be attained so long as it is embedded in such a manner that the sum of the cross sectional area of the conductor-side superconductor and the cross sectional area of the electrode-side superconductor is exceeded by the overlapping surface area of the superconductors across the joint part of the mating conductor.

Figure 4:
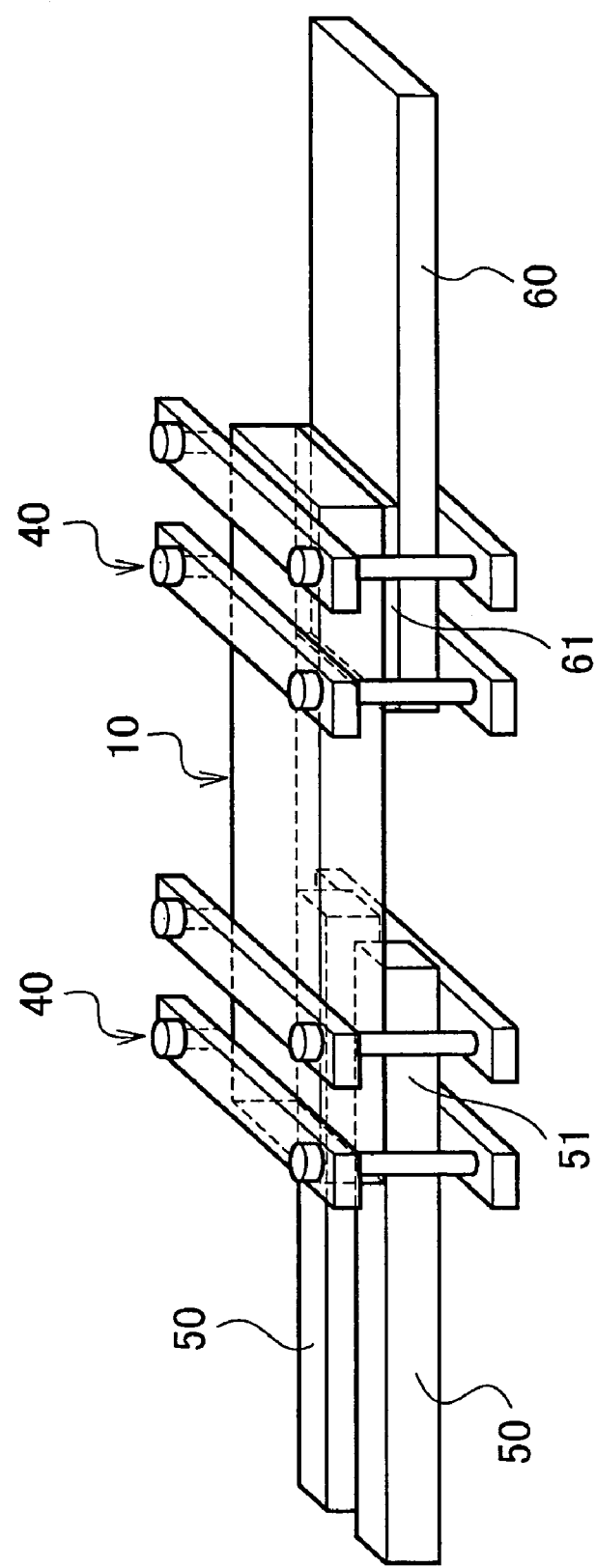
FIG. 4 shows another example of connecting a conductor on a power supply side and a conductor on a system side using the composite conductor of the present invention.
Figure 5:
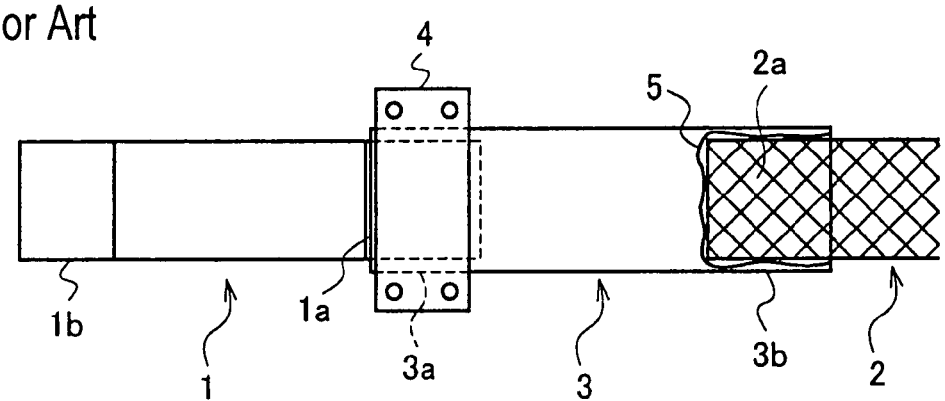
FIG. 5 is a plane view showing a connecting example using a conventional connecting conductor.

Furthermore, when plural current leads 50, 50 are joined together in parallel as shown in FIG. 4, the similar effect can be attained in each joint part, allowing the complicated joint parts to be compact.

EXPERIMENTAL EXAMPLE 1

Hereinafter, the embodiment of the present invention will be explained further in detail based on the experimental example.

(1) Manufacturing the Oxide Superconductor

Each raw powder of $Gd_2O_3$, $BaCO_3$, and CuO is weighed and so mixed that the mole ratio is Gd:Ba:Cu=1:2:3, calcined at 920° C. for 30 hours, ground into particles of 3 μm in average size using a pot mill, again calcined at 930° C. for 30 hours, and ground into particles of 10 μm in average size using a mortar and a pot mill, to form the $Gd_1Ba_2Cu_3O_{7-x}$ powder, which is the first calcined powder.

Then, each raw powder referred to above is weighed and so mixed that the mole ratio is Gd:Ba:Cu=2:1:1, calcined at 890° C. for 20 hours, and ground into particles of 0.7 μm in average size using the pot mill, to form the $Gd_2BaCuO_5$ powder, which is the second calcined powder.

The first and second calcined powders are so weighed that the mole ratio be $Gd_1Ba_2Cu_3O_{7-x}$:$Gd_2BaCuO_5$=1:0.4, to which Pt powder (average particle size: 0.01 μm) and $Ag_2O$ powder (average particle size: 13.8 μm) are further blended, to form synthetic powder, where the content of Pt is 0.42 wt %, and the content Ag is 15 wt %.

This synthetic powder is press-molded with a planar mold into a precursor of 77 mm in length, 105 mm in width, and 26 mm in thickness. With this precursor disposed in a furnace, the following process is carried out.

First, the temperature is raised from room temperature to 1100° in 70 hours, and kept thereat for 20 minutes so that the precursor is in a semi-molten state, after which a temperature gradient of 5° C./cm is vertically imposed on the precursor in such a manner that the upper portion of the precursor forms a low-temperature side, and the temperature of the upper portion is lowered at 0.4° C./min to 995° C.

Here, a crystal having a composition of $Nd_{1.8}Ba_{2.4}Cu_{3.4}O_x$ not containing Ag and containing 0.5 wt % of Pt which is made in advance by a melting method is cut out into the length of 2 mm, width of 2 mm, thickness of 1 mm, to form a seed crystal. The seed crystal is brought into contact with the center of the upper portion of the precursor in such a manner that the growing direction of the seed crystal is in parallel to the c axis, after which the temperature of the upper portion of the precursor is lowered from 995° C. to 985° C. at a cooling speed of 1° C. per hour. The temperature is maintained for 100 hours and thereafter, gradually lowered to 915° C. in 70 hours, after which the lower portion of the precursor is cooled to 915° C. in 20 hours so that the vertical temperature gradient becomes 0° C./cm. Thereafter, gradual cooling to room temperature is carried out by spending 100 hours, as a result of which a crystal sample of the oxide superconductor is obtained.

When this crystal sample of the oxide superconductor is cut in the vicinity of the center along the longitudinal direction thereof and observed in cross section by using EPMA, the $Gd_{2+r}Ba_{1+s}(Cu_{1-d}Ag_d)O_{5-y}$ phase of about 0.1 to 30 μm in size is observed to be finely dispersing in the $Gd_{1+p}Ba_{2+q}(Cu_{1-b}Ag_b)_3O_{7-x}$ phase. Here, each of p, q, r, s, and y has a value of −0.2 to 0.2, and x has a value of −0.2 to 0.6. Further, b and d have a value of 0.0 to 0.05, and an averaged value of about 0.008. Also, it is found that Ag each being about 0.1 to 100 μm in size is finely dispersing within the entire crystal sample. Furthermore, the holes of about 5 to 200 μm in size are dispersed in a part deeper than 1 mm from the surface. It is also observed that the entire sample of crystals reflects the seed crystal and is oriented in a uniform direction so that the thickness direction of the disc-shaped material is in parallel to the c axis, and the orientation deviation among adjacent crystals are 3 degrees or less, suggesting that the crystal sample which is substantially monocrystal is obtained. When the part deeper than 1 mm from the surface of this crystal sample was cut out and the density was measured, it was 7.0 g/cm³ (91.1% of the theoretical density which is 7.68 g/cm³).

A prismatic oxide superconductor to be used as a superconductor in the composite conductor is cut out in a part deeper than 1 mm from the surface of the obtained crystal sample, using the following method.

The prismatic oxide superconductor has such a shape that the thickness is 3 mm, the entire longitudinal length is 85 mm, and the width is 4 mm.

Such an oxide superconductor is cut out of the crystal sample in a manner that its longitudinal direction is in parallel to the a-b surface of the crystal. Incidentally, it is two prismatic oxide superconductors that are cut out.

(2) Providing Silver Coating to the Oxide Superconductors

First, an organic vehicle formed by mixing ethyl cellulose of 10 wt %, terpineol of 30 wt %, dibutyl phthalate of 50 wt %, and butyl carbitol acetate of 10 wt %, is mixed with Ag powder with the average particle size of 3 µm, by a mole ratio of 3:7. To the mixture, 2% phosphoric ester is added, so that an Ag paste is formed.

Next, the Ag paste is applied over the entire surface of the prismatic oxide superconductors prepared as described in (1) above, in thickness of 50 µm.

The oxide superconductors applied with the Ag paste are vacuum impregnated, and thereafter dried in an oven at 80° C. in the atmosphere. Then, the two oxide superconductors applied with the Ag paste are again calcined at 920° C. in the furnace for ten hours, so that Ag is calcined thereinto and silver coating is formed, whereby silver-coated oxide superconductors are produced. After being calcined, the film thickness of Ag is about 30 µm.

(3) Providing Anneal Treatment to the Silver Coated Oxide Superconductor

By disposing the silver coated oxide superconductor in a separate gas-replicable furnace, first, the furnace is evacuated using a rotary pump so that the pressure therein becomes 0.1 Torr. Then, an oxygen gas is flown into the furnace to form an atmosphere which is in such an atmospheric pressure that the oxygen partial pressure is 99% or higher. Thereafter, the anneal treatment of the silver-coated oxide superconductor is performed in a manner that: the temperature is raised from room temperature to 450° C. by spending 10 hours while the oxygen gas is flown into the furnace at a flowing rate of 0.5 L/min.; gradually lowered from 450° C. to 250° C. in 400 hours; and further lowered from 250° C. to room temperature in 10 hours.

(4) Forming a Metal Conductor and a Metal Conductor Lid

A metal conductor and a metal conductor lid are formed by processing an oxygen-free copper with purity of 4N, and the surface of each is Sn-plated.

The outside dimension is 180 mm in entire length, 15 mm in width, and 15 mm in thickness. In the metal conductor, a superconductor-embedding groove with the entire length of 170.8 mm, the width of 4.5 mm, and the depth of 9.3 mm is carved at approximate center of the composite conductor. A clearance between the groove and the oxide superconductor is such that the oxide superconductor is placed in the center portion of the metal conductor, and keeps a space of approximately 0.25 mm on one side from an inner wall of the embedding groove.

On the other hand, the metal conductor lid is formed in such a manner that after the oxide superconductor is disposed in the superconductor embedding groove of the metal conductor, the lid is fit to the metal conductor to be integrated with the outer shape thereof. However, at this time, the lid should be able to keep a space of approximately 0.25 mm on one side from the inner wall of the embedding groove of the metal conductor and the oxide superconductor.

(5) Disposing the Oxide Superconductor into the Metal Conductor

As a jointing metal, Cerasolzer 143 (hereinafter referred to as "Cerasolzer") which is a PbSn solder is molten and applied to the embedding groove of the metal conductor. Meanwhile, Cerasolzer is molten and applied also to the silver coated portion of the oxide superconductor.

Subsequently, after heating the metal conductor and the oxide superconductor to a temperature identical to the melting point or higher of the applied jointing metal, the oxide superconductor is set in the embedding groove of the metal conductor, and the metal conductor lid is disposed thereon.

(6) Providing Degassing Treatment to the Jointing Metal

When setting is completed, the entire set is heated at 180° C. which is higher than the melting point of Cerasolzer (143° C.), to allow Cerasolzer to be sufficiently molten. The entire set is then quickly put into a vacuum container for degassing at about 100 Pa for two minutes. Then, using a supersonic soldering iron, mechanical shock is imposed by this drift suppressing member, to burst pores existing in Cerasolzer.

As a result, by the jointing metal not containing pores, the metal conductor, the oxide superconductor, and the metal conductor lid are joined in a preferable state both electrically and mechanically.

(7) Evaluating Characteristics of the Composite Conductor

Here, in order to evaluate the effect of the oxide superconductor embedded in the metal conductor exerted to the contact resistance value between the relevant composite conductor and mating conductors thereof, an additional metal conductor is formed which is identical to the conductor according to the present invention except that it does not provide a superconductor therein and the embedding groove, for the purpose of comparison.

A method to evaluate the effect of the oxide superconductor in the metal conductor exerted to the contact resistance value between the relevant composite conductor and the mating conductors thereof by using the composite conductor according to the present invention and the metal conductor for comparison as described above will be explained with reference to FIG. 4.

Here, FIG. 4 is an external perspective view in which each of a metal electrode conductor of a power-supply-side current lead (hereinafter referred to as "power-supply-side conductor") or a metal plate conductor for pressure contacting a system-side superconducting wire (hereinafter referred to as "system-side conductor") is joined to the left and the right of the composite conductor according to the present invention, through an indium foil of 0.1 mm thickness, and using a clamp.

In order to measure the resistance values of the joint parts between the composite conductor and the power-supply-side conductor, and between the composite conductor and the system-side conductor, a stainless voltmeter terminal is soldered to a diagonal position of each of an opposite surface in the portion to which the end portion of each conductor is joined.

Subsequently, the power-supply is connected to the current lead electrode on an opposite side of the composite conductor connecting side and to the system-side superconducting wire on an opposite side of the composite conductor connecting side. Then, the current lead, composite conductor, and superconducting wire are cooled to 4.2 K, and current of up to 1060 A is fed therethrough at intervals of 10 A. Here, the voltage is measured through the stainless wire attached in advance, and the contact resistance value R caused in the joint part is calculated based on the V-I characteristic slope.

Further, the same measurement is carried out for the metal conductor which is in the same shape as the above metal conductor, but does not have a groove for embedding the superconductor, that is to say, not having an oxide superconductor embedded therein.

As a result of the measurement, the resistance value R is 0.2 µΩ at the joint part of the composite conductor of the present invention and the system-side conductor, and 1.3 µΩ at the joint part of the composite conductor of the present invention and the power-side conductor. On the other hand, in the metal conductor prepared for comparison, the resistance value is 1.9 μΩ in a joint part with the system-side conductor, and 2.6 μΩ in a joint part with the power-supply-side conductor.

As is evident from this result, the contact resistance value R of the current lead of the present invention compared to the current lead for the comparison is about ½ lower when the counterpart is a normal conducting wire, and about ⅒ lower when the counterpart is superconducting wire.

As a last experiment, the composite conductor sample is cut along the current carrying direction in order to measure percentage of the volume of the pores in the jointing metal provided in the joint part between the oxide superconductor and the metal electrode with respect to the volume of the joint part. The result is that the volume of the pores in the jointing metal makes up about 0.1% of the volume of the joint part, which is a low value.

What claimed is:

1. A composite conductor, comprising:
   a superconductor provided in a current flowing direction; and
   a metal conductor joined to said superconductor and provided at least in a joint part with mating conductors to be joined,
   wherein an electric current is fed and received when the mating conductor is joined with said metal conductor,
   wherein said superconductor is disposed in said metal conductor so as to be approximately parallel to the joint interface between said metal conductor and the mating conductor;
   wherein said metal conductor and said superconductor are joined by interposing a jointing metal therebetween, and
   wherein the volume of pores present in the jointing metal occupies not more than 5% of the volume of a gap at the joint part.

2. The composite conductor according to claim 1,
   wherein said superconductor is formed in an almost columnar shape, and disposed so that the longitudinal direction thereof is approximately parallel to the joint interface.

3. The composite conductor according to claim 2,
   wherein said superconductor is an oxide superconductor formed by a melting method.

4. The composite conductor according to claim 2,
   wherein said superconductor is formed by joining a plurality of conductors.

5. A superconductor apparatus system using the composite conductor according to claim 2.

6. The composite conductor according to claim 1,
   wherein said superconductor is an oxide superconductor formed by a melting method.

7. The composite conductor according to claim 6,
   wherein said superconductor is formed by joining a plurality of conductors.

8. A superconductor apparatus system using the composite conductor according to claim 6.

9. The composite conductor according to claim 1,
   wherein said superconductor is formed by joining a plurality of conductors.

10. A superconductor apparatus system using the composite conductor according to claim 9.

11. A superconductor apparatus system using the composite conductor according to claim 1.

12. A superconductor apparatus system using the composite conductor according to claim 1.

13. A manufacturing method of a composite conductor comprising a superconductor provided in a flowing direction of an electric current, and a metal conductor joined with said superconductor and provided at least in a joint part with a mating conductor to be joined, wherein the electric current is fed and received between said metal conductor and the mating conductor when the mating conductor is joined with said metal conductor, the method of manufacturing the composite conductor comprising:
    heating the joint part at or above a melting point of the jointing metal; and
    reducing the pressure to degas the jointing metal when the oxide superconductor and the metal electrode are joined with each other by the jointing metal;
    wherein said superconductor is disposed in said metal conductor so as to be approximately parallel to the joint interface between said metal conductor and the mating conductor;
    wherein said metal conductor and said superconductor are joined by interposing a jointing metal therebetween, and
    wherein the volume of pores present in the jointing metal occupies not more than 5% of the volume of a gap at the joint part.

* * * * *

UNITED STATES PATENT AND TRADEMARK OFFICE
CERTIFICATE OF CORRECTION

| | |
|---|---|
| PATENT NO. | : 7,319,195 B2 |
| APPLICATION NO. | : 10/995333 |
| DATED | : January 15, 2008 |
| INVENTOR(S) | : Shuichi Kohayashi et al. |

Page 1 of 1

It is certified that error appears in the above-identified patent and that said Letters Patent is hereby corrected as shown below:

Title page, item [73]; after "Tokyo (JP)" insert --; Chubu Electric Power Co., Inc., Nagoya (JP)--

Signed and Sealed this

Twenty-eighth Day of April, 2009

JOHN DOLL
*Acting Director of the United States Patent and Trademark Office*